US010778232B2

(12) United States Patent
Aylward (10) Patent No.: US 10,778,232 B2
(45) Date of Patent: Sep. 15, 2020

(54) VOLTAGE CONTROLLED OSCILLATOR

(71) Applicant: Rakon Limited, Auckland (NZ)

(72) Inventor: Kevin Alan Neil Aylward, Stevenage (GB)

(73) Assignee: RAKON UK LIMITED, Essex (GB)

( * ) Notice: Subject to any disclaimer, the term of this patent is extended or adjusted under 35 U.S.C. 154(b) by 41 days.

(21) Appl. No.: 15/903,226

(22) Filed: Feb. 23, 2018

(65) Prior Publication Data
US 2018/0375524 A1    Dec. 27, 2018

(30) Foreign Application Priority Data
Feb. 23, 2017    (NZ) ........................................ 729453

(51) Int. Cl.
| | |
|---|---|
| *H03L 1/02* | (2006.01) |
| *H03L 1/04* | (2006.01) |
| *H03L 7/099* | (2006.01) |
| *H03B 5/32* | (2006.01) |
| *H03B 5/04* | (2006.01) |

(52) U.S. Cl.
CPC ............ *H03L 1/028* (2013.01); *H03B 5/04* (2013.01); *H03B 5/32* (2013.01); *H03L 1/022* (2013.01); *H03L 1/027* (2013.01); *H03L 1/04* (2013.01); *H03L 7/099* (2013.01)

(58) Field of Classification Search
CPC ....... H03L 7/1077; H03L 7/099; H03L 1/027; H03L 1/028; H03L 1/022; H03L 1/04; B23P 19/04; G01R 23/02
See application file for complete search history.

(56) References Cited

U.S. PATENT DOCUMENTS

| | | | | |
|---|---|---|---|---|
| 6,002,291 A | * | 12/1999 | Gilbert ..................... | G06G 7/20 327/129 |
| 6,549,055 B2 | | 4/2003 | Rokos | |

FOREIGN PATENT DOCUMENTS

WO    WO-2015193539 A1 * 12/2015 ............. H03B 5/368

* cited by examiner

*Primary Examiner* — Jeffrey M Shin
(74) *Attorney, Agent, or Firm* — Dann, Dorfman, Herrell and Skillman, P.C.

(57) ABSTRACT

A voltage controlled oscillator implements optimising its effective frequency versus voltage transfer function by generating and applying a frequency control signal via a function having a plateau region and a higher slope region, where a horizontal position of the higher slope region, a slope value in the higher slope region, and a function value change magnitude over the higher slope region are adjustable.

32 Claims, 7 Drawing Sheets

VOLTAGE CONTROLLED OSCILLATOR

FIELD OF THE INVENTION

The present invention relates to Voltage Controlled Oscillators wherein the oscillators' effective transfer function is modified by regenerating the frequency control signal as a single, or a combination of a number of, signals generated as suitable functions of the initial frequency control signal.

BACKGROUND OF THE INVENTION

A Voltage Controlled Oscillator is an electronic circuit capable of generating an output signal of a certain nominal frequency Farr, and wherein the output frequency can be controlled by changing the value of frequency control voltage applied to the frequency control voltage input.

In Voltage Controlled Crystal Oscillators (VCXOs), the frequency control voltage is applied to a voltage controlled variable capacitance ("varactor") or a circuit functionally equivalent to a varactor; when the frequency control voltage value changes, the varactor's capacitance changes too, causing in turn the oscillator's frequency $F_{OUT}$ to change, thus effecting the desired output frequency control function.

The frequency versus voltage transfer function of a VCXO is usually non-linear due to non-linearity of the varactor's capacitance versus voltage transfer function, as well as non-linearities of the oscillator circuit. Moreover, the shape of VCXOs' frequency versus voltage transfer function is different for different VCXO samples.

VCXOs find application in the implementation of many electronic circuit functions and devices, including but not limited to Phase Lock Loops (PLLs), electronic frequency multipliers, Temperature Compensated Crystal Oscillators (TCXOs), etc.

Figure 1:
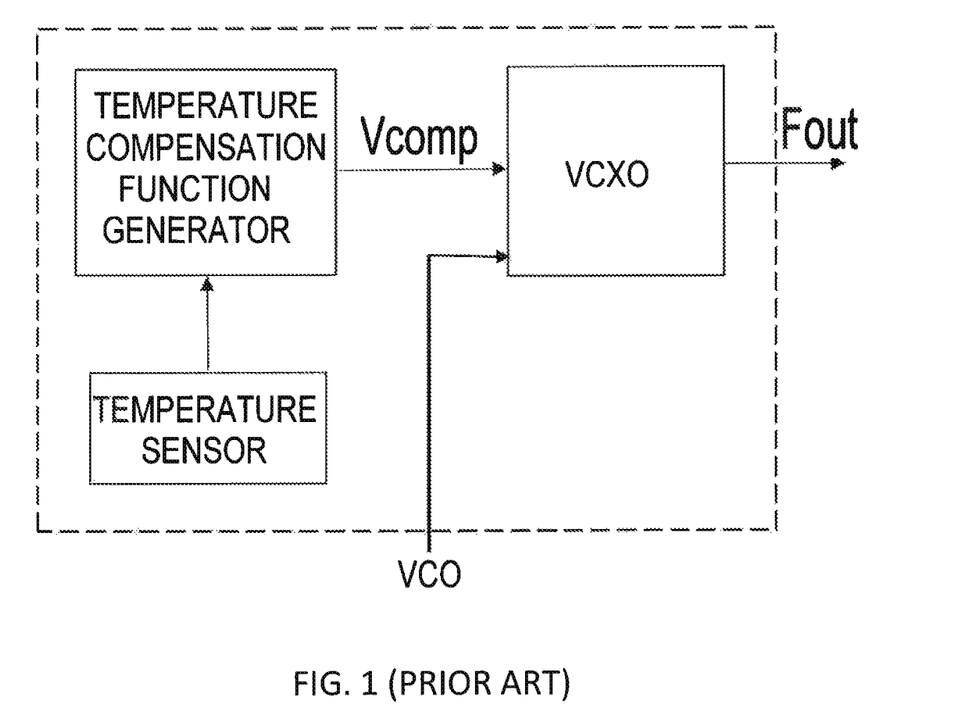
FIG. 1 shows the structure of an analog VCTCXO (prior art).

In at least some applications, it is desirable that a Voltage Controlled Oscillator exhibits a particular and consistent shape of its effective frequency versus voltage transfer function. Often, a linear shape is required. An example of such an application is a type of crystal oscillator called Voltage Controlled Temperature Compensated Crystal Oscillator (VCTCXO). In many contemporary VCTCXOs, temperature compensation is achieved by generating a temperature-dependent compensation voltage and applying it to an internal Voltage Controlled Crystal Oscillator (VCXO). The structure of such VCTCXO devices is shown in FIG. 1 (prior art). In this diagram, the VCXO is a tunable circuit that produces an output signal of required frequency $F_{OUT}$. The output frequency $F_{OUT}$ is temperature-dependent. In order to improve the frequency Farr versus temperature stability, a Temperature Compensation Function Generator is used to produce temperature compensating voltage $V_{COMP}$, and the latter is applied to the VCXO to correct the output frequency for the effects of ambient temperature changes. The compensating voltage is produced as a function of the Temperature Sensor output signal and the function is tailored so that, in conjunction with the VCXO's frequency versus temperature characteristic, the application of the $V_{COMP}$ voltage reduces the output frequency $F_{OUT}$ instability caused by ambient temperature changes.

User-controlled VCO voltage allows the VCTCXO user to tune the VCTCXO device by changing the VCO voltage level. The temperature compensation voltage $V_{COMP}$ generated by the Temperature Compensation Function Generator is usually optimized at a certain fixed level of the externally applied VCO voltage, such as the midpoint of the VCO voltage range. This means that the $V_{COMP}$ voltage is optimized for a single value of the VCXO's frequency versus voltage characteristic slope. When the user-controlled VCO voltage is changed to a different value within the VCO range, the slope of the VCXO's frequency versus voltage characteristic changes too, and yet the compensating voltage $V_{COMP}$ remains the same; this leads to the VCTCXO device becoming either over- or under-compensated at VCO voltages other than the one that the $V_{COMP}$ was optimized at. The industry terms used to designate such deterioration of temperature compensation accuracy when external frequency control voltage level changes are "pulling skew", "trimming skew", "compensation tilt", etc. It will be appreciated by persons skilled in the art that if the VCXO's frequency versus voltage characteristic slope was constant, the effect of the temperature compensating voltage $V_{COMP}$ would be the same regardless of the frequency control voltage VCO value. In other words, a linear effective VCXO transfer function would eliminate "compensation tilt".

Attempts are known to reduce such an undesirable deterioration of temperature compensation accuracy when the external frequency control voltage changes. For example, using the method for generating an input signal for a tunable circuit disclosed in the U.S. Pat. No. 6,549,055, it is possible to improve the linearity of the effective VCXO frequency versus voltage characteristic by pre-distorting the VCXO control signal using a polynomial approximation function to "substantially correct" for the non-linearities in the VCXO circuit. Such polynomial approximation methods are capable of reducing the non-linearity of the effective VCXO transfer characteristic to about 1%; any further non-linearity reduction by such methods is impossible due to the fact that the frequency versus voltage transfer function of a VCXO cannot be accurately defined by a simple mathematical expression such as a polynomial function.

The present invention offers a useful way of further reducing the compensation tilt errors in VCTCXO devices, by regenerating the VCXO control signal as a single, or a combination of a number of, signals generated as suitable functions of the initial frequency control signal.

SUMMARY OF THE INVENTION

In broad terms, the present invention offers a useful way of adjusting a voltage controlled oscillator's effective frequency versus voltage transfer function to match a desired shape.

As one of its possible applications and embodiments, the present invention provides a practicable VCXO effective transfer function linearization technique that makes it possible to further reduce frequency instability in Voltage Controlled Temperature Compensated Crystal Oscillators (VCTCXOs).

According to the present invention a frequency control signal is regenerated as one, or a combination of two or more, signals generated as functions of the initial frequency control signal, and the thus formed tuning signal is applied to the voltage controlled oscillator to modify the oscillator's effective frequency versus voltage transfer function shape. The functions used to generate the frequency control voltage signal of the present invention can be any one or more functions that satisfy the following requirements:

the function has a region approximating a plateau, and a substantially higher slope region; and
  the said two regions are connecting continuously (i.e., without discontinuities) and smoothly; and
  the horizontal position of the substantially higher slope region, the slope value in the substantially higher slope region, and the function value change magnitude over the substantially higher slope region are adjustable.

The last requirement allows to adjust the control signal to modify any particular voltage controlled oscillator's effective frequency versus voltage transfer function to match the desired transfer function shape much closer than what is achieved by the current state of the art.

At least in some embodiments, "a region approximating a plateau" or "a plateau region" means a region of the function curve that exhibits a linear asymptotic approach to a zero slope (horizontal) line.

The "substantially higher slope region" is a region of the function curve having a slope that is substantially higher than the slope in the plateau region; in at least some embodiments, the slope value in the substantially higher slope region of the function is adjustable within the range from 0.01 V/V to 80 V/V, or within part of that range.

A number of functions satisfying the abovementioned requirements can be used to implement the control signal generators in the devices of the present invention. For example, sigmoid functions are suitable for implementing the control signal generation technique, as sigmoid functions satisfy the aforementioned requirements. In particular, since a sigmoid function is bounded by a pair of horizontal asymptotes and first derivative (i.e., slope) of a sigmoid function is bell shaped, a sigmoid function has two regions approximating plateaux and a region where the function slope value is substantially higher than that in the plateauing regions.

The choice of specific function to a large extent depends on how practicable it is to generate it in electronics hardware of the kind used in a given device.

The magnitude, slope, and horizontal position of the said single, or a number of, generated function signals are adjusted for every device so that the frequency control signal, formed as a single, or a combination of two or more, generated function signals, is optimized for the shape of the particular voltage controlled oscillator's frequency versus control voltage transfer curve.

It may be best if the functions chosen to be used for generating the one or more signals to form the frequency control signal are such that the horizontal position of the substantially higher slope region, the slope value in the substantially higher slope region, and the function value change magnitude over the substantially higher slope region are adjustable independently from each other, although functions with interactions between these parameters can be also deployed, as the interactions can be accounted for when optimal parameter values are being determined.

The shape of the regenerated frequency control signal formed according to the invention depends on the shape of the VCXO's transfer function curve. Since every VCXO sample's transfer function curve shape is different, the slope of the function signals generated according to the invention, the functions' horizontal position, and their magnitude are adjustable.

The required slope adjustment range depends on the range of transfer function curve slopes exhibited by a given population of VCXOs. In at least some embodiments, a function slope adjustment range from about 0.04 V/V to about 10 V/V is sufficient; in other embodiments, a wider slope adjustment range from about 0.1 V/V to about 25 V/V is required; in yet other embodiments, an even wider slope adjustment range from about 0.3 V/V to about 75 V/V is required. A function slope adjustment range different than those mentioned above may be required to form the regenerated control signal to suit the extent of transfer function curve variability within a given VCXO population.

The horizontal position of each of the generated functions is adjustable to cover at least the initial frequency control voltage range specified for a given VCXO population. In some embodiments, the horizontal position of the generated functions is arranged to be adjustable within the voltage range from about 0.25V to about 2.65V; in other embodiments, a wider horizontal position adjustment range from close to zero volts to about 4V is required. A horizontal position adjustment range different than those mentioned above may be required to suit the control voltage range of a given VCXO population.

The magnitude of each of the generated functions is adjustable to produce the required magnitude of the regenerated control signal. In at least some embodiments, it is sufficient that the magnitude of function signals generated according to the present invention is adjustable within a range of about ±1V (i.e., a total range of about 2V); in other embodiments, the required function magnitude adjustment range is wider and extends to about ±2V (i.e., a total range of about 4V). A function magnitude adjustment range different than those mentioned above may be required to regenerate the frequency control signal in a given VCXO population.

Without sacrificing the generality of the concept of the present invention, the invention is illustrated further herein through the use of a Hyperbolic Tangent (Tanh) function, which is one of the functions of the sigmoid function set. This function is particularly suitable for devices implemented in a bipolar semiconductor integrated circuit process. Without deviating from the concept of the present invention, a person skilled in the art may select different functions to implement the devices of the present invention; for example, for devices implemented in a different semiconductor process, an Arctangent (arctan) function may be more suitable. No matter which specific function is chosen, it must satisfy the requirements mentioned above.

In broad terms in another aspect the invention comprises a method of manufacturing voltage controlled oscillators which each comprise an electronic circuit arranged to produce a regenerated frequency control signal comprising at least one signal generated as a function of an initial frequency control signal, which comprises the steps of, characterizing each oscillator's frequency versus voltage transfer function;

causing said at least one signal to comprise a plateau region, and a continuously and smoothly connected substantially higher slope region; and for each oscillator individually adjusting a horizontal position of the substantially higher slope region, a slope value in the substantially higher slope region, and a function value change magnitude over the substantially higher slope region, to optimize the regenerated control signal for the individual oscillator.

In broad terms in a further aspect the invention comprises a voltage controlled oscillator, comprising an electronic circuit arranged to produce a regenerated frequency control signal comprising at least one signal generated as a function of an initial frequency control signal, which function comprises a plateau region, and a continuously and smoothly connected substantially higher slope region, and wherein any one or more of a horizontal position of the substantially higher slope region, a slope value in the substantially higher slope region, and a function value change magnitude over the substantially higher slope region are adjustable.

The term "comprising" as used in this specification and claims means "consisting at least in part of". When interpreting each statement in this specification and claims that includes the term "comprising", features other than that or those prefaced by the term may also be present. Related terms such as "comprise" and "comprises" are to be interpreted in the same manner.

The term "frequency versus voltage transfer function" as used in relation to a voltage controlled oscillator means the function relating the oscillator's output frequency to the voltage at the oscillator's voltage control input. The term "effective frequency versus voltage transfer function" means the function relating the oscillator's output frequency to the initial frequency control signal's voltage. It will be understood that in cases where the initial frequency control signal is not modified or regenerated, but connected to the voltage controlled oscillator's input, the "frequency versus voltage transfer function" and "effective frequency versus voltage transfer function" coincide.

In at least some embodiments any one or more of the aforementioned adjustments of a horizontal position of the substantially higher slope region, of a slope value in the substantially higher slope region, and of a function value change magnitude over the substantially higher slope region, can be effected indirectly and as a consequence of adjusting other function parameters. For example, adjusting the horizontal position of a region where the substantially higher slope region and the plateau region are connecting will have the effect of effectively adjusting the horizontal position of the substantially higher slope region. Similarly, and as another example, adjusting the relative horizontal positions of, or spacing between, regions where the substantially higher slope region is connecting to each of the two plateau regions in a sigmoid function will have the effect of effectively adjusting the slope of the higher slope region. As yet another example, adjusting the magnitude of the function change over another region may have the consequential effect of adjusting the function value change magnitude over the substantially higher slope region. In other words, any one or more of the function adjustments of a horizontal position of the substantially higher slope region, of a slope value in the substantially higher slope region, and of a function value change magnitude over the substantially higher slope region can be implemented as either direct, or indirect adjustments of these function parameters. In this specification and claims references to adjusting or adjustment of the horizontal position of the substantially higher slope region, slope value in the substantially higher slope region, and function value change magnitude over the substantially higher slope region, should be understood accordingly.

BRIEF DESCRIPTION OF THE DRAWINGS

The invention is further described with reference to the accompanying figures in which.

DETAILED DESCRIPTION OF THE INVENTION

Further herein, the present invention is illustrated by an embodiment where it is used to improve the frequency stability in VCTCXO devices by reducing the "compensation tilt" errors.

In order to minimize a VCTCXO's frequency stability errors, the VCXO control signal is generated using the techniques of the present invention and applied to the VCXO (the latter comprises part of a VCTCXO, as shown in FIG. 1 (prior art)). Depending on the shape of the VCXO's frequency versus voltage transfer function, the VCXO control signal is formed as one, or a combination of two or more, signals generated as functions of the initial frequency control signal, with said functions satisfying the set of specific requirements mentioned above.

Figure 2:
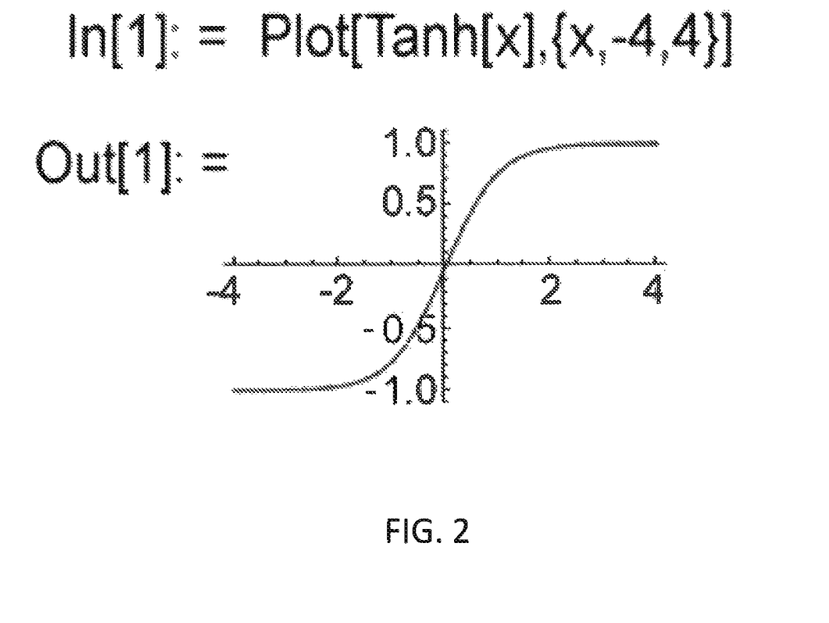
FIG. 2 shows example plot of a Tanh function.

An example of such a function is the Hyperbolic Tangent (Tanh) function. An example plot of a Tanh function is shown in FIG. 2. Advantageously, the Hyperbolic Tangent (Tanh) function generates a smooth, rounded and bounded analog curve which is highly suitable for minimizing VCTCXOs' "compensation tilt" errors.

Another advantage of the Tanh function is that Tanh function signals can be readily generated using bipolar electronic circuits, as a bipolar differential transistor pair has a Tanh response.

The Tanh function can be mathematically expressed in a number of different ways. The following equation lends itself to convenient manipulation:

$$y = \frac{e^{2X} - 1}{e^{2X} + 1}$$

By adding adjustable coefficients to the above equation, the magnitude (vertical gain), slope, and horizontal position (inflection point) of the Tanh curve can be adjusted:

$$y = \underset{\underset{Gain}{Vertical}}{a} \frac{e^{2b(x-c)} - 1}{e^{2b(x-c)} + 1}$$

where $b$ is Slope and $c$ is Inflection.

Figure 3:
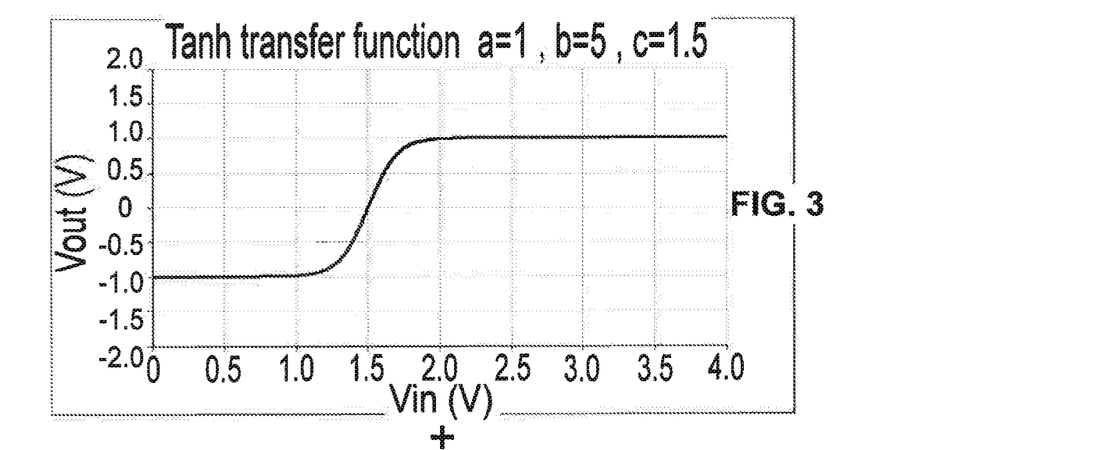
FIGS. 3, 3a, and 3b show an example of two Tanh functions (FIGS. 3 and 3a) that are formed using different values of adjustable coefficients, and the sum of these two functions (FIG. 3b).
Figure 3A:
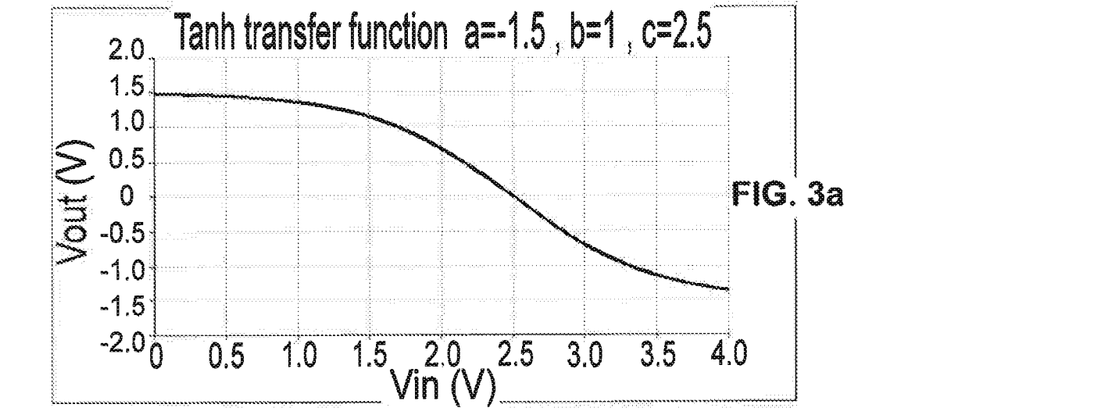
Figure 3B:
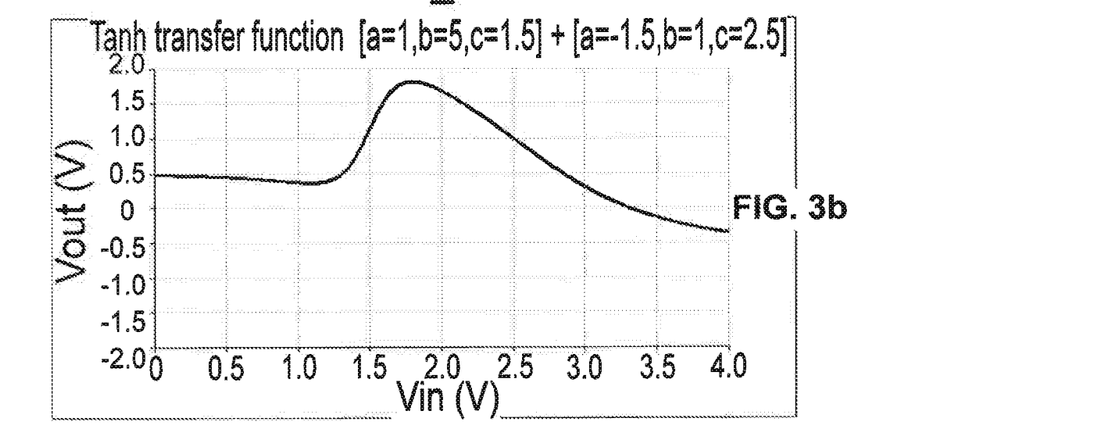

Furthermore, by generating and combining multiple Tanh curves it is possible to form a highly variable smooth curve that closely matches a given VCXO's transfer function curve. Plots shown in FIG. 3 present an example of two Tanh functions that are formed using different sets of "a", "b", and "c" coefficients, and the sum of these two functions. The first of the three plots shows the first Tanh function, formed with a=1, b=5, and c=1.5. The second plot shows the second Tanh function, formed with a=−1.5, b=1, and c=2.5. The third plot shows the sum of the two Tanh functions.

Figure 4:
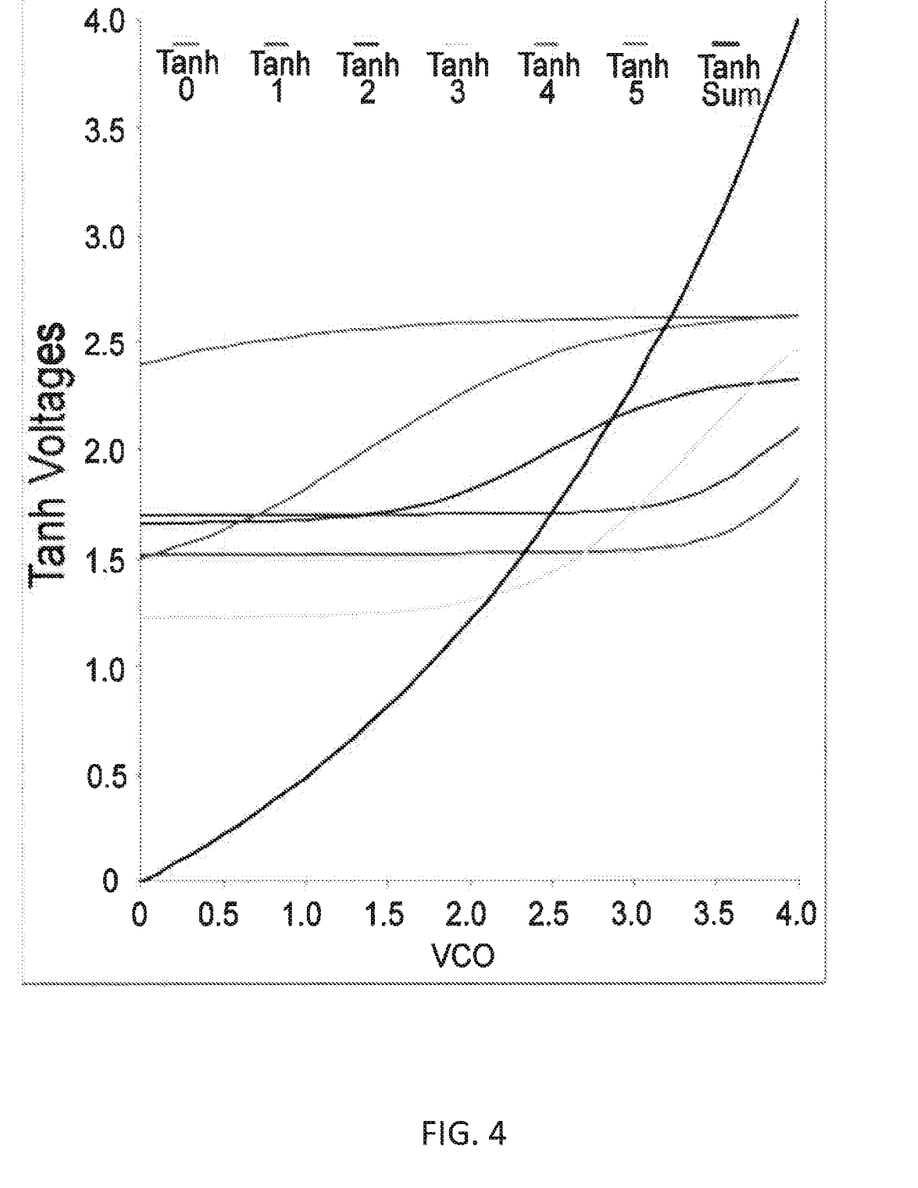
FIG. 4 shows six individual Tanh function signals combined to form a desired shape function.

By generating one or more Tanh signals (voltages or currents) and combining them, one can form a VCXO control signal that is suitable to reduce the VCXO's effective transfer function non-linearity and therefore the VCTCXO's "compensation tilt" frequency errors. The plot shown in FIG. 4 shows six individual Tanh function signals combined to form a desired shape function.

Figure 5:
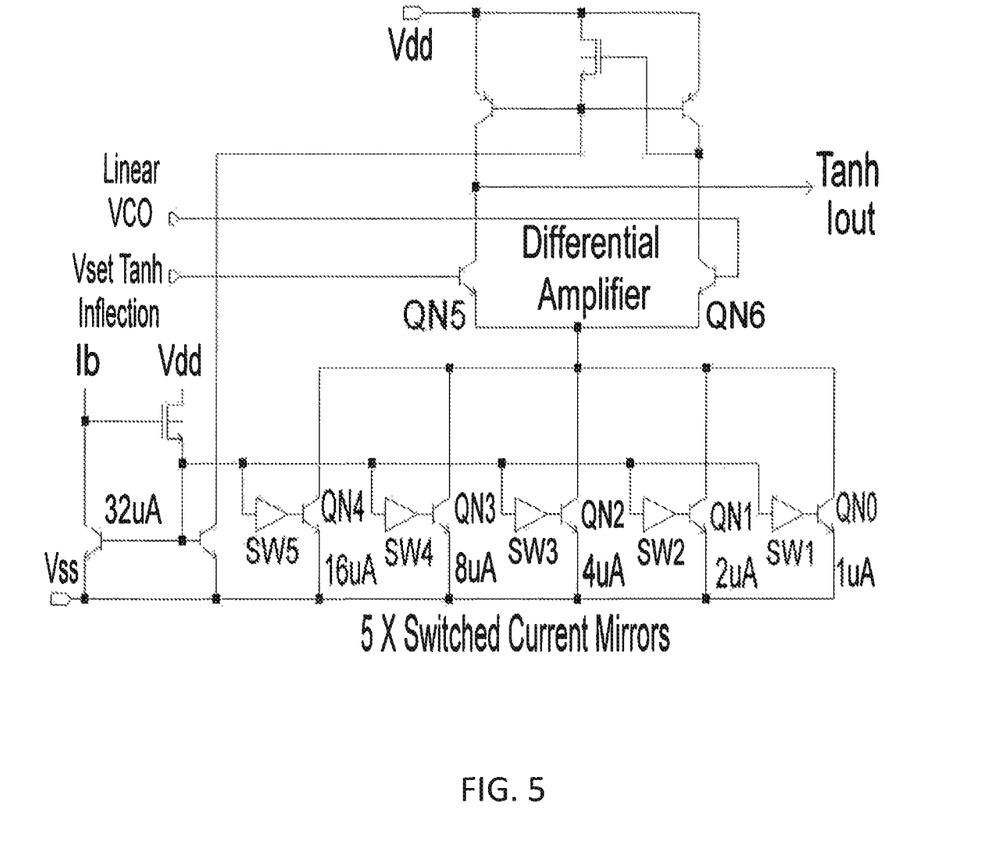
FIG. 5 shows an example of an electronic circuit arranged to generate a Tanh function signal.

An example of an electronic circuit arranged to generate a Tanh function signal is shown in FIG. 5. In this circuit, an appropriately sloped VCXO frequency control voltage named "Linear VCO" is used as one of the input voltages and the Tanh function argument; the tail current of the differential amplifier QN5, QN6, defined by binary switched current mirrors comprising transistors QN0 to QN4 and switches SW1 to SW5, sets the gain of the Tanh function; and "Vset Tanh Inflection" voltage sets the horizontal position of the Tanh function. This circuit will generate one Tanh function signal (current "Tanh $I_{OUT}$") that is can be combined with other, similarly generated, Tanh function signals to match the desired shape of the target VCXO transfer function.

Figure 6:
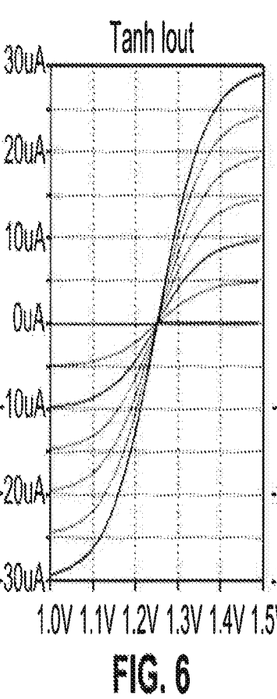
FIGS. 6, 6a, and 6b illustrate the adjustments of a generated Tanh function.
Figure 6A:
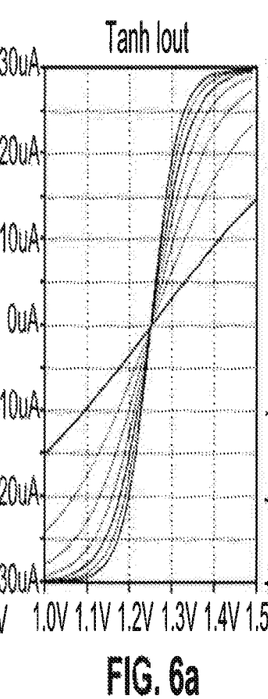
Figure 6B:
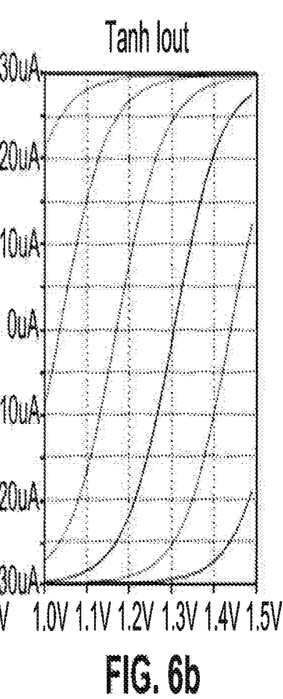

The three graphs shown in FIGS. 6, 6a, and 6b illustrate how peak-to-peak amplitude (the function value change magnitude over the substantially higher slope region), the slope value in the substantially higher slope region, and the inflection point (horizontal position of the substantially higher slope region) of the Tanh function generated by the circuit shown in FIG. 5 can be adjusted by changing the corresponding input signals.

Possible Tanh function generating circuit implementations are not limited to the example shown in FIG. 5, and a person skilled in the art of electronic circuit design will be able to come up with alternative circuits to generate Tanh function signals.

Several instances of the circuit shown in FIG. 5, or of an alternative circuit generating a chosen suitable function signal, are likely to be used in a typical embodiment of this invention to generate and combine a number of generated function signals and form a VCXO control signal to reduce the VCTCXO's "compensation tilt" errors. Such VCXO linearization technique allows to further reduce the residual effective frequency versus voltage transfer function non-linearity from about 1% (current state of the art) to values that are at least an order of magnitude smaller (i.e., about 0.1% or less).

It will be appreciated by persons skilled in the art that the number of function signals generated to form a frequency control signal according to the present invention depends on the shape of a given VCXO's transfer function. In at least some embodiments of the invention, several (two or more) function signals will be generated. While there are a number of functions satisfying the aforementioned requirements, in at least some embodiments several signals of the same function type will be generated, with the choice of specific function type defined largely by the practicalities of generating the function in the electronics hardware deployed.

Figure 7:
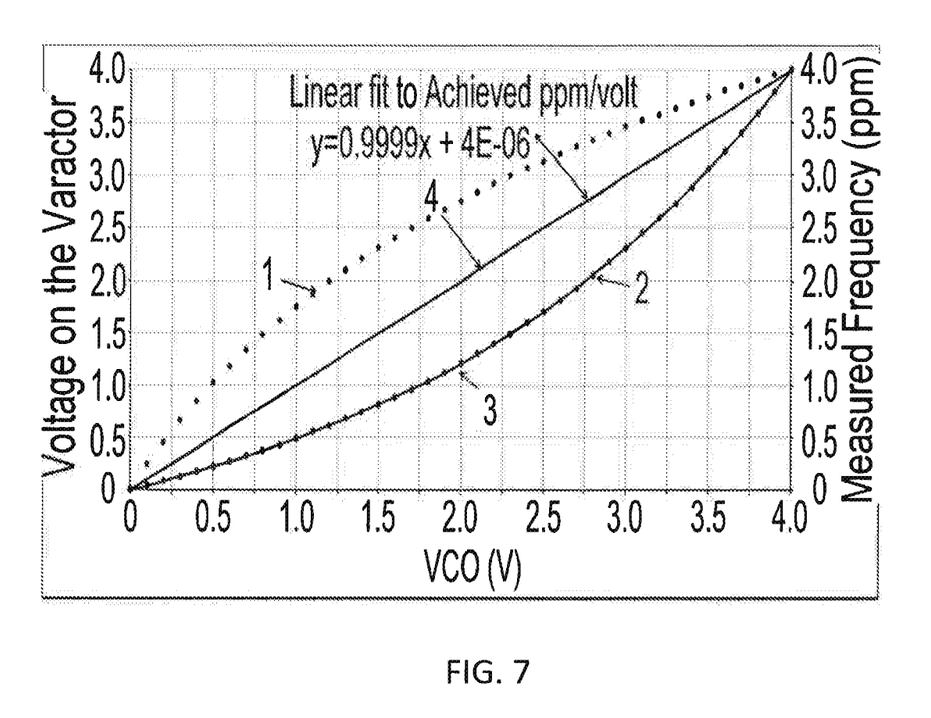
FIG. 7 shows measurement data of a VCXO linearized using a technique of the present invention.

The graph in FIG. 7 shows measured data of a VCXO linearized with a linearization circuit combining six generated Tanh function signals. The upper dotted line 1 shows the initial non-linear frequency versus voltage transfer function of the VCXO circuit. The lower dotted line 2 shows the required control voltage to be generated by the Tanh linearization circuit in order to achieve a linear effective VCXO transfer curve. The continuous curved line 3 shows the regenerated frequency control signal. As can be seen from the graph, the required and the actual control voltage curves are very close. The achieved modified effective VCXO transfer function is shown as the middle line 4 in the plot. A linear fit done to this line shows that the residual non-linearity of the resulting effective VCXO transfer curve is about 0.01%.

The VCXO effective transfer function linearization technique of the invention has a number of advantages over approximation with polynomial functions or over piecewise approximation, such as, all function generating circuits deployed in a VCTCXO device of the invention are active across the entire frequency control voltage range, thus causing no discontinuities in the resulting effective frequency versus voltage curve;

the individual function curves can be adjusted in order to form a VCXO control signal to fit any or almost any individual VCXO transfer function curve.

Figure 8:
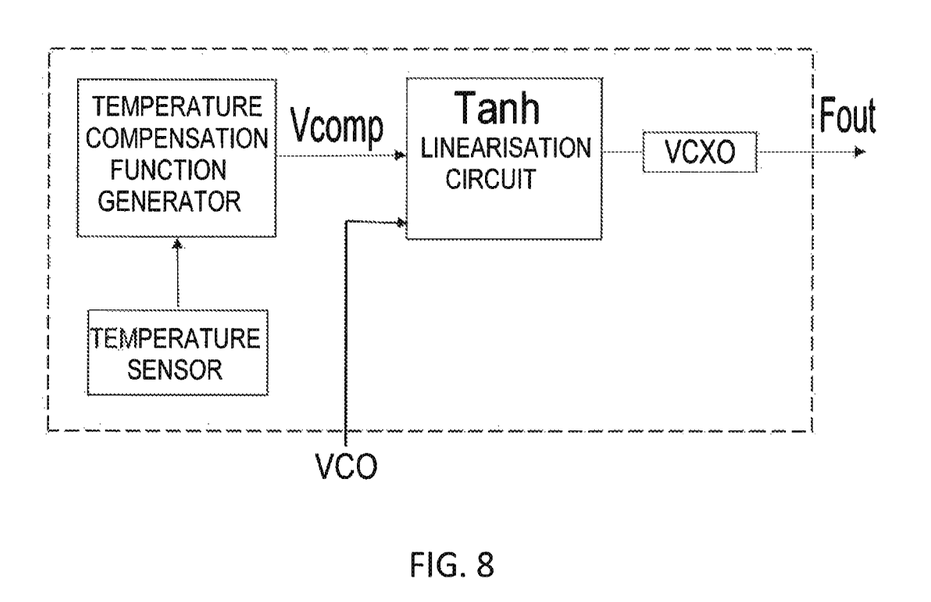
FIG. 8 shows an example structure of a VCTCXO Integrated Circuit C deploying a VCXO linearization technique of the present invention.

The VCXO linearization technique of the present invention can be implemented as part of a VCTCXO Integrated Circuit (IC). An example structure of a VCTCXO IC deploying the VCXO linearization technique of the present invention is shown in FIG. 8. In this example, the temperature compensation voltage $V_{COMP}$ generated by the Temperature Compensation Function Generator is combined with the externally applied frequency control voltage VCO, and the combined signal is used to form a VCXO frequency control voltage as either a single, or as a combination of two or more, signals generated as Tanh functions in the "Tanh Linearization Circuit" block as per the present invention, and the thus formed control signal is applied to the VCXO circuit. In this example, the Tanh Linearization Circuit generates Tanh function signals; as pointed out before, other suitable functions can be used, as long as the selected functions satisfy the following requirements:

the function must have a region approximating a plateau, and a substantially higher slope region; and the said two regions are connecting continuously (i.e., without discontinuities) and smoothly; and the horizontal position of the substantially higher slope region, the slope value in the substantially higher slope region, and the function value change magnitude over the substantially higher slope region are adjustable.

Without deviating from the concept of the present invention, the signals generated as Tanh functions, or as any other functions satisfying the aforementioned requirements, can be generated either by analog circuits (such as, for example, the circuit shown in FIG. 5), or by digital circuits (such as a microcontroller). In either case, the signals are generated as functions of the initial frequency control signal, which can be an analog signal (for example, a user-controlled analog tuning signal), or a digital signal (for example, a user-controlled digital tuning signal, or a digitized analog tuning signal).

In the embodiments described above all of the horizontal position of the higher slope region, slope value in the higher slope region, and the function value change magnitude over the higher slope region are adjustable. However in other embodiments any one only or two only of the horizontal position of the higher slope region, slope value in the higher slope region, and function value change magnitude over the higher slope region may be adjustable. For example it may be sufficient in some applications for only the horizontal position and function value change magnitude to be adjustable.

The higher frequency stability of VCTCXO devices implemented using the techniques of the present invention will benefit the performance of any electronic apparatus where stable reference frequency versus temperature characteristics are required. Such apparatus include, but are not limited to, portable and stationary telecommunication equipment, high speed networking equipment, radio communication equipment, and navigation equipment.

The invention claimed is:

1. A voltage controlled oscillator device, comprising:
a frequency control input arranged to accept an externally generated frequency control signal,
an analog electronic circuit arranged to produce an internally generated frequency control signal comprising a signal generated as a non-linear function of the externally generated frequency control signal by subjecting the externally generated frequency control signal to a non-linear transformation, wherein the said function has a plateau region and a continuously and smoothly connected substantially higher slope region, and wherein
a horizontal position of the substantially higher slope region, a slope value in the substantially higher slope region, and a function value change magnitude over the substantially higher slope region are electronically adjustable.

2. A voltage controlled oscillator device according to claim 1, wherein the internally generated frequency control signal comprises a combination of two or more signals generated as non-linear functions of the externally generated frequency control signal by subjecting the externally generated frequency control signal to non-linear transformations, wherein at least one of said non-linear functions has a plateau region and a continuously and smoothly connected substantially higher slope region, and
wherein a horizontal position of the substantially higher slope region, a slope value in the substantially higher slope region, and a function value change magnitude over the substantially higher slope region are electronically adjustable.

3. A voltage controlled oscillator device according to claim 1, wherein said non-linear function comprises a sigmoid function.

4. A voltage controlled oscillator device according to claim 3, wherein said sigmoid function comprises a Hyperbolic Tangent (Tanh) function.

5. A voltage controlled oscillator device according to claim 3, wherein said sigmoid function comprises an Arctangent (arctan) function.

6. A voltage controlled oscillator device according to claim 2, wherein two or more of said functions of the externally generated frequency control signal have a plateau region and a continuously and smoothly connected substantially higher slope region.

7. A voltage controlled crystal oscillator device according to claim 6, wherein two or more of said functions comprise a sigmoid function.

8. An integrated circuit suitable to construct a voltage controlled oscillator device, comprising:
a frequency control input arranged to accept an externally generated frequency control signal,
an analog electronic circuit arranged to produce an internally generated frequency control signal comprising a signal generated as a non-linear function of the externally generated frequency control signal by subjecting the externally generated frequency control signal to a non-linear transformation, wherein the said function has a plateau region, and a continuously and smoothly connected substantially higher slope region, and wherein
a horizontal position of the substantially higher slope region, a slope value in the substantially higher slope region, and a function value change magnitude over the substantially higher slope region are electronically adjustable.

9. An integrated circuit according to claim 8, wherein the internally generated frequency control signal comprises a combination of two or more signals generated as non-linear functions of the externally generated frequency control signal by subjecting the externally generated frequency control signal to non-linear transformations, wherein at least one of said non-linear functions has a plateau region, and a continuously and smoothly connected substantially higher slope region, and
wherein a horizontal position of the substantially higher slope region, a slope value in the substantially higher slope region, and a function value change magnitude over the substantially higher slope region are electronically adjustable.

10. An integrated circuit according to claim 8, wherein said non-linear function comprises a sigmoid function.

11. An integrated circuit according to claim 10, wherein said sigmoid function comprises a Hyperbolic Tangent (Tanh) function.

12. An integrated circuit according to claim 10, wherein said sigmoid function comprises an Arctangent (arctan) function.

13. An integrated circuit according to claim 9, wherein two or more of said non-linear functions of the externally generated frequency control signal have a plateau region and a continuously and smoothly connected substantially higher slope region.

14. An integrated circuit according to claim 13, wherein two or more of said functions comprise a sigmoid function.

15. An electronic apparatus comprising the voltage controlled crystal oscillator according to claim 1.

16. A method of manufacturing voltage controlled oscillator devices, which devices each comprise a frequency control input arranged to accept an externally generated frequency control signal, each device being characterizable by an effective transfer function relating the device's output frequency to the externally generated frequency control signal, a voltage controlled oscillator circuit arranged to accept a frequency control signal generated internally to the device, the voltage controlled oscillator circuit characterizable by a transfer function relating the voltage controlled oscillator circuit's output frequency to the internally generated frequency control signal, and an analog electronic circuit arranged to produce the internally generated frequency control signal comprising one or more signals generated as a non-linear function of the externally generated frequency control signal, the said non-linear function comprising a plateau region, and a continuously and smoothly connected substantially higher slope region, which method comprises the steps of:
for each device individually, characterizing the voltage controlled oscillator circuit's transfer function; and
for each device individually, for each of said one or more signals adjusting any one or more of a horizontal position of the substantially higher slope region, a slope value in the substantially higher slope region, and a function value change magnitude over the substantially higher slope region to modify the effective transfer function.

17. A voltage controlled oscillator device, comprising:
a frequency control input arranged to accept an externally generated frequency control signal, an analog electronic circuit arranged to produce an internally generated frequency control signal comprising a signal generated as a non-linear function of the externally generated frequency control signal by subjecting the externally generated frequency control signal to a non-linear transformation, wherein the said function has a plateau region and a continuously and smoothly connected substantially higher slope region, and wherein any one or more of a horizontal position of the substantially higher slope region, a slope value in the substantially higher slope region, and a function value change magnitude over the substantially higher slope region are electronically adjustable.

18. A voltage controlled oscillator device according to claim 17, wherein the internally generated frequency control signal comprises a combination of two or more signals generated as non-linear functions of the externally generated frequency control signal by subjecting the externally generated frequency control signal to non-linear transformations, wherein at least one of said non-linear functions has a plateau region and a continuously and smoothly connected substantially higher slope region, and wherein any one or more of a horizontal position of the substantially higher slope region, a slope value in the substantially higher slope region, and a function value change magnitude over the substantially higher slope region are electronically adjustable.

19. A voltage controlled oscillator device according to claim 17, wherein said non-linear function comprises a sigmoid function.

20. A voltage controlled oscillator device according to claim 19, wherein said sigmoid function comprises a Hyperbolic Tangent (Tanh) function.

21. A voltage controlled oscillator device according to claim 19, wherein said sigmoid function comprises an Arctangent (arctan) function.

22. A voltage controlled oscillator device according to claim 18, wherein two or more of said functions of the externally generated frequency control signal have a plateau region and a continuously and smoothly connected substantially higher slope region.

23. A voltage controlled crystal oscillator device according to claim 22, wherein two or more of said functions comprise a sigmoid function.

24. An integrated circuit suitable to construct a voltage controlled oscillator device, comprising:
    a frequency control input arranged to accept an externally generated frequency control signal,
    an analog electronic circuit arranged to produce an internally generated frequency control signal comprising a signal generated as a non-linear function of the externally generated frequency control signal by subjecting the externally generated frequency control signal to a non-linear transformation, wherein the said function has a plateau region and a continuously and smoothly connected substantially higher slope region, and wherein any one or more of a horizontal position of the substantially higher slope region, a slope value in the substantially higher slope region, and a function value change magnitude over the substantially higher slope region are electronically adjustable.

25. An integrated circuit according to claim 24, wherein the internally generated frequency control signal comprises a combination of two or more signals generated as non-linear functions of the externally generated frequency control signal by subjecting the externally generated frequency control signal to non-linear transformations, wherein at least one of said non-linear functions has a plateau region and a continuously and smoothly connected substantially higher slope region, and wherein any one or more of a horizontal position of the substantially higher slope region, a slope value in the substantially higher slope region, and a function value change magnitude over the substantially higher slope region are electronically adjustable.

26. An integrated circuit according to claim 24, wherein said non-linear function comprises a sigmoid function.

27. An integrated circuit according to claim 26, wherein said sigmoid function comprises a Hyperbolic Tangent (Tanh) function.

28. An integrated circuit according to claim 26, wherein said sigmoid function comprises an Arctangent (arctan) function.

29. An integrated circuit according to claim 25, wherein two or more of said non-linear functions of the externally generated frequency control signal have a plateau region and a continuously and smoothly connected substantially higher slope region.

30. An integrated circuit according to claim 29, wherein two or more of said functions comprise a sigmoid function.

31. An electronic apparatus comprising the voltage controlled oscillator device according to claim 17.

32. A method of manufacturing voltage controlled oscillator devices, which devices each comprise a frequency control input arranged to accept an externally generated frequency control signal, each device being characterizable by an effective transfer function relating the device's output frequency to the externally generated frequency control signal, a voltage controlled oscillator circuit arranged to accept a frequency control signal generated internally to the device, the voltage controlled oscillator circuit characterizable by a transfer function relating the voltage controlled oscillator circuit's output frequency to the internally generated frequency control signal, and an analog electronic circuit arranged to produce the internally generated frequency control signal comprising one or more signals generated as a non-linear function of the externally generated frequency control signal, the said non-linear function comprising a plateau region, and a continuously and smoothly connected substantially higher slope region, which method comprises the steps of:
    for each device individually, characterizing the voltage controlled oscillator circuit's transfer function; and
    for each device individually, for each of said one or more signals adjusting any one or more of a horizontal position of the substantially higher slope region, a slope value in the substantially higher slope region, and a function value change magnitude over the substantially higher slope region to reduce non-linearity of the effective transfer function.

* * * * *

UNITED STATES PATENT AND TRADEMARK OFFICE
CERTIFICATE OF CORRECTION

PATENT NO. : 10,778,232 B2  
APPLICATION NO. : 15/903226  
DATED : September 15, 2020  
INVENTOR(S) : Kevin Alan Neil Aylward Page 1 of 1

It is certified that error appears in the above-identified patent and that said Letters Patent is hereby corrected as shown below:

In the Claims

Column 9:  
Line 52 (Claim 7, Line 1), after "controlled" delete "crystal".

Column 10:  
Line 35 (Claim 15, Line 2), after "-trolled" delete "crystal", and after "oscillator" insert -- device --.

Column 11:  
Line 42 (Claim 23, Line 1), after "controlled" delete "crystal".

Signed and Sealed this  
Twenty-sixth Day of October, 2021

Drew Hirshfeld  
*Performing the Functions and Duties of the*  
*Under Secretary of Commerce for Intellectual Property and*  
*Director of the United States Patent and Trademark Office*